(12) United States Patent
Sato et al.

(10) Patent No.: US 10,804,488 B2
(45) Date of Patent: Oct. 13, 2020

(54) DISPLAY DEVICE

(71) Applicant: Japan Display Inc., Tokyo (JP)

(72) Inventors: Toshihiro Sato, Tokyo (JP); Ryoichi Ito, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/197,548

(22) Filed: Nov. 21, 2018

(65) Prior Publication Data

US 2019/0109296 A1 Apr. 11, 2019

Related U.S. Application Data

(63) Continuation of application No. 15/484,683, filed on Apr. 11, 2017, now Pat. No. 10,170,727, which is a
(Continued)

(30) Foreign Application Priority Data

Aug. 30, 2013 (JP) ................................. 2013-179505

(51) Int. Cl.
*G06F 3/041* (2006.01)
*G09G 3/30* (2006.01)
(Continued)

(52) U.S. Cl.
CPC .......... *H01L 51/5246* (2013.01); *G06F 3/044* (2013.01); *H01L 27/323* (2013.01); *H01L 27/3253* (2013.01); *H01L 51/5225* (2013.01)

(58) Field of Classification Search
CPC ............. H01L 51/0085; H01L 51/0084; H01L 51/0087; H01L 51/006; H01L 51/0059;
(Continued)

(56) References Cited

U.S. PATENT DOCUMENTS 6,573,660 B2 6/2003 Sundahl
7,936,338 B2 * 5/2011 Iwase .................... G06F 3/0418
345/173

(Continued)

FOREIGN PATENT DOCUMENTS

CN 101626017 A 1/2010
CN 102299166 A 12/2011
(Continued)

OTHER PUBLICATIONS

Korean Office Action for corresponding Korean Application No. 10-2014-0112513 dated Oct. 1, 2015.
(Continued)

*Primary Examiner* — Mary A Wilczewski
*Assistant Examiner* — Tsz K Chiu
(74) *Attorney, Agent, or Firm* — Michael Best & Friedrich LLP

(57) ABSTRACT

An organic electroluminescent device with a touch sensor including: a first substrate; a second substrate arranged opposite to the first substrate; an organic EL element layer arranged above the first substrate; a first sealing film arranged toward the second substrate of the organic EL element layer, covering the organic EL element layer, and including a first inorganic layer; plural first detection electrodes extending in one direction, and arranged in parallel toward the second substrate of the first sealing film; a second sealing film arranged toward the second substrate of the first detection electrodes, and including a second inorganic layer; plural second detection electrodes extending in another direction different from the one direction, and arranged in parallel toward the second substrate of the second sealing film; and a touch sensor control unit control ling a potential to detect a touch with a display surface.

6 Claims, 9 Drawing Sheets

Related U.S. Application Data continuation of application No. 14/469,634, filed on Aug. 27, 2014, now Pat. No. 9,660,003.

(51) Int. Cl.
*H01L 51/52* (2006.01)
*H01L 27/32* (2006.01)
*G06F 3/044* (2006.01)

(58) Field of Classification Search
CPC ............. H01L 51/0072; H01L 51/0074; H01L 51/5016; C07F 15/0033; C09K 11/06; C09K 2211/1007; C09K 2211/1044; C09K 2211/185
See application file for complete search history.

(56) References Cited

U.S. PATENT DOCUMENTS

| | | | |
|---|---|---|---|
| 8,970,520 | B2 | 3/2015 | Teraguchi et al. |
| 9,323,372 | B2 | 4/2016 | Kim et al. |
| 9,444,059 | B2 | 9/2016 | Inoue et al. |
| 9,660,003 | B2 | 5/2017 | Sato et al. |
| 2002/0000979 | A1 | 1/2002 | Furuhashi et al. |
| 2007/0063985 | A1 | 3/2007 | Yamazaki et al. |
| 2007/0075316 | A1 | 4/2007 | Yamazaki et al. |
| 2008/0211395 | A1 | 9/2008 | Koshihara et al. |
| 2008/0278070 | A1 | 11/2008 | Kim |
| 2009/0002337 | A1* | 1/2009 | Chang ............... G06F 3/044 345/174 |
| 2010/0007616 | A1* | 1/2010 | Jang ............... G06F 3/0412 345/173 |
| 2010/0020032 | A1 | 1/2010 | Mamba et al. |
| 2010/0033443 | A1 | 2/2010 | Hashimoto |
| 2010/0214247 | A1 | 8/2010 | Tang et al. |
| 2010/0265187 | A1 | 10/2010 | Chang et al. |
| 2010/0265206 | A1 | 10/2010 | Chen |
| 2011/0253709 | A1 | 10/2011 | Kang et al. |
| 2011/0316802 | A1 | 12/2011 | Choi |
| 2012/0075230 | A1 | 3/2012 | Nagata |
| 2012/0169644 | A1 | 7/2012 | Nagata et al. |
| 2012/0182250 | A1 | 7/2012 | Nagata et al. |
| 2014/0014960 | A1 | 1/2014 | Yamazaki et al. |

FOREIGN PATENT DOCUMENTS

| | | |
|---|---|---|
| JP | 2008-216543 A | 9/2008 |
| JP | 2008-269604 A | 11/2008 |
| JP | 2010-020315 A | 1/2010 |
| JP | 2010-205222 A | 9/2010 |
| JP | 2011-023558 A | 2/2011 |
| JP | 2012-156140 A | 8/2012 |
| JP | 2013-084026 A | 5/2013 |
| KR | 10-2010-0007717 A | 1/2010 |
| KR | 10-2011-0020049 A | 3/2011 |
| TW | 201301613 A | 1/2013 |

OTHER PUBLICATIONS

Taiwanese Office Action for corresponding Taiwanese Application No. 103127500 dated Oct. 26, 2015.
Chinese Office Action dated Nov. 30, 2016 for corresponding Chinese Patent Application No. 201410436244.4.
Japanese Office Action dated Mar. 14, 2017 for corresponding JP Patent Application No. 2013-179505, With Partial Translation.
Japanese Office Action dated Oct. 30, 2018 for corresponding Japanese Patent Application No. 2017-229083, with computer generated English translation.

* cited by examiner

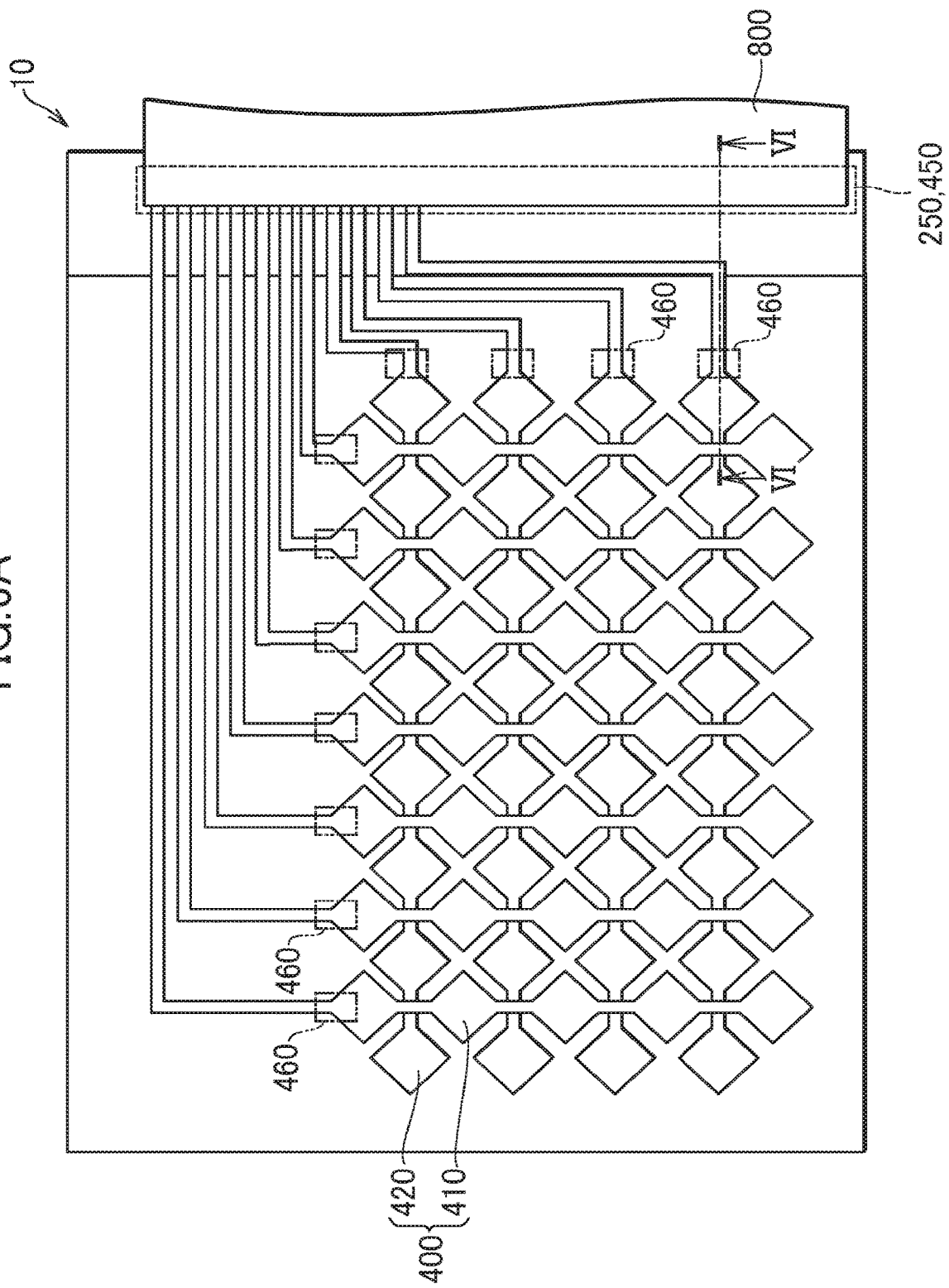

DISPLAY DEVICE

CROSS-REFERENCE TO RELATED APPLICATIONS

This application is a continuation of U.S. patent application Ser. No. 15/484,683, filed on Apr. 11, 2017, which, in turn, is a continuation of U.S. patent application Ser. No. 14/469,634 (now U.S. Pat. No. 9,660,003), filed on Aug. 27, 2014. Further, this application claims priority from Japanese patent application Number 2013-179505 filed on Aug. 30, 2013, the entire contents of which are hereby incorporated by reference into this application.

BACKGROUND OF THE INVENTION

1. Field of the Invention

The present invention relates to a display device.

2. Description of the Related Art

JP-2012-156140 A discloses an organic light emitting display device including: a substrate; a display part that is formed on the substrate; a sealing substrate having a surface that faces the substrate; a capacitance type touch unit having plural first sensors that are formed on any surface of the sealing substrate to be aligned along a first direction, and plural second sensors that are formed to be aligned in a second direction intersecting the first direction; and an insulating layer that is formed on at least a part of the first sensor and the second sensor, in which the first sensors and the second sensors are formed on any identical surface of the sealing substrate, the plural first sensors and the plural second sensors are made of ITO, formed on the surface of the sealing substrate, sense touch to generate an electric signal, and output electric signals generated in each of the plural first sensors and the plural second sensors of the touch unit through data lines, the display part has thin film transistors formed on the substrate, and organic light emitting elements coupled with the thin film transistors, each of the organic light emitting elements has a counter electrode, a pixel electrode, and an intermediate layer formed between the counter electrode and the pixel electrode, the pixel electrode comes in contact with the thin film transistor, the intermediate layer comes in contact with at least a part of the pixel electrode, the counter electrode comes in contact with at least a part of the intermediate layer, the touch unit is formed directly on one surface of the sealing substrate, and the display part is formed directly on one surface of the substrate.

Also, JP 2008-216543 A discloses organic electroluminescent device having an input function, including; an element substrate having a light emitting layer held between a pair of electrodes, a sealing substrate that seals the element substrate; a first detection electrode that is disposed on an inner surface side of the sealing substrate; a second detection electrode that is disposed on an outer surface side of the sealing substrate, and has a detection axis different from that of the first detection electrode, a dielectric film that is laminated on the second detection electrode; and detection means for detecting a formation position of a capacitance formed between the first and second detection electrodes through the dielectric film.

SUMMARY OF THE INVENTION

As a method giving an input function on a display screen of the organic EL device, a method of appending a touch panel (touch sensor) to a surface of a display screen, and conducting operation by a finger or a pen, as disclosed in, for example, JP 2012-156140 A, and JP 2008-216543 A is realized.

However, the display device with the touch sensor in which the touch panel is adhered to the surface of the display screen as another member, or provides the touch sensor function in a part of the counter substrate of the display device as disclosed JP 2012-156140 A and JP 2008-216543 A is large in the thickness of the device per se, and hardly satisfies a demand for thinning electronic devices in recent years.

In view of the above problem, the present inventors have earnestly studied the provision of a display device with a touch sensor which is thinner than the display device with the touch sensor in which the touch panel is adhered to the surface of the display screen as another member, or provides the touch sensor function in a part of the counter substrate of the display device.

An object of the present invention is to provide an organic electroluminescent device with a touch sensor which is thinner than the display device with the touch sensor in which the touch panel is adhered to the surface of the display screen as another member, or provides the touch sensor function in a part of the counter substrate of the display device.

Also, the above and other objects, and novel features of the present invention will become apparent from the description of the present specification, and the attached drawings.

In order to solve the above problem, according to the present invention, there is provided a display device, including: a first substrate in which pixels each having a thin-film transistor are arranged in a matrix on an insulating surface; a second substrate that is arranged opposite to the first substrate; an organic EL element layer that is arranged above the first substrate and between the first substrate and the second substrate, and emits light under control by a circuit including the thin film transistor; a first sealing film which is arranged toward the second substrate of the organic EL element layer, covers the organic EL element layer, and includes at least a first inorganic layer made of inorganic material; a plurality of first detection electrodes that extend in one direction, and are arranged in parallel toward the second substrate of the first sealing film; a second sealing film that is arranged toward the second substrate of the first detection electrodes, and includes at least a second inorganic layer made of an inorganic material; a plurality of second detection electrodes that extend in another direction different from the one direction, and are arranged in parallel toward the second substrate of the second sealing film; and a touch sensor control unit that controls a potential of any one of the first detection electrodes and the second detection electrodes, and detects an electric change generated in the other detection electrodes to detect a touch with a display surface.

Also, each of the first detection electrodes and the second detection electrodes may have a shape having continuous rectangles (stripes) and/or continuous rhombs (diamonds). Also, each of the first detection electrodes and the second detection electrodes may be formed through any one of a sputtering method and a printing method.

Also, the first sealing film may have a planarizing layer made of an organic material toward the second substrate of the first inorganic layer.

Also, the planarizing layer may have a thickness of 1 to 100 μm. Also, a connection terminal for connection with the touch sensor control, unit, and a connection terminal for connection with an organic EL element control unit for controlling the light emission of the organic EL element layer may be formed in the same plane of the first substrate.

According to the present invention, there is provided an organic electroluminescent device with a touch sensor which is thinner than the display device with the touch sensor in which the touch panel is adhered to the surface of the display screen as another member, or provides the touch sensor function in a part of the counter substrate of the display device.

BRIEF DESCRIPTION OF THE DRAWINGS

FIG. 6A is a plan view schematically illustrating an arrangement of detection electrodes included in an organic electroluminescent device with a touch sensor according to another embodiment of the present invention.

DETAILED DESCRIPTION OF THE INVENTION

First Embodiment

According to the first embodiment of the present invention, there is provided a display device, including: a first substrate in which pixels each having a thin-film transistor are arranged in a matrix on an insulating substrate; a second substrate that is arranged opposite to the first substrate; an organic EL element layer that is arranged on the first substrate and between the first substrate and the second substrate, and emits light under control by a circuit including the thin film transistor; a first sealing film which is arranged on a side of the organic EL element layer opposite to the second substrate side, and covers the organic EL element layer; a plurality of first detect ion electrodes that extend in one direction, and are arranged in parallel in a partial area on a side of the first sealing film opposite to the second substrate; a second sealing film that is arranged to cover another area that is an outside of the partial area in which the first detection electrodes are arranged, and a side of the first detection electrodes opposite to the second substrate; a plurality of second detection electrodes that extend in another direction different from the one direction, and are arranged in parallel in a partial area on a side of the second sealing film opposite to the second substrate; and a touch sensor control unit that controls a potential of any one of the first detection electrodes and the second detection electrodes, and detects an electric change generated in the other detection electrodes to detect a touch with a display surface.

Figure 1:
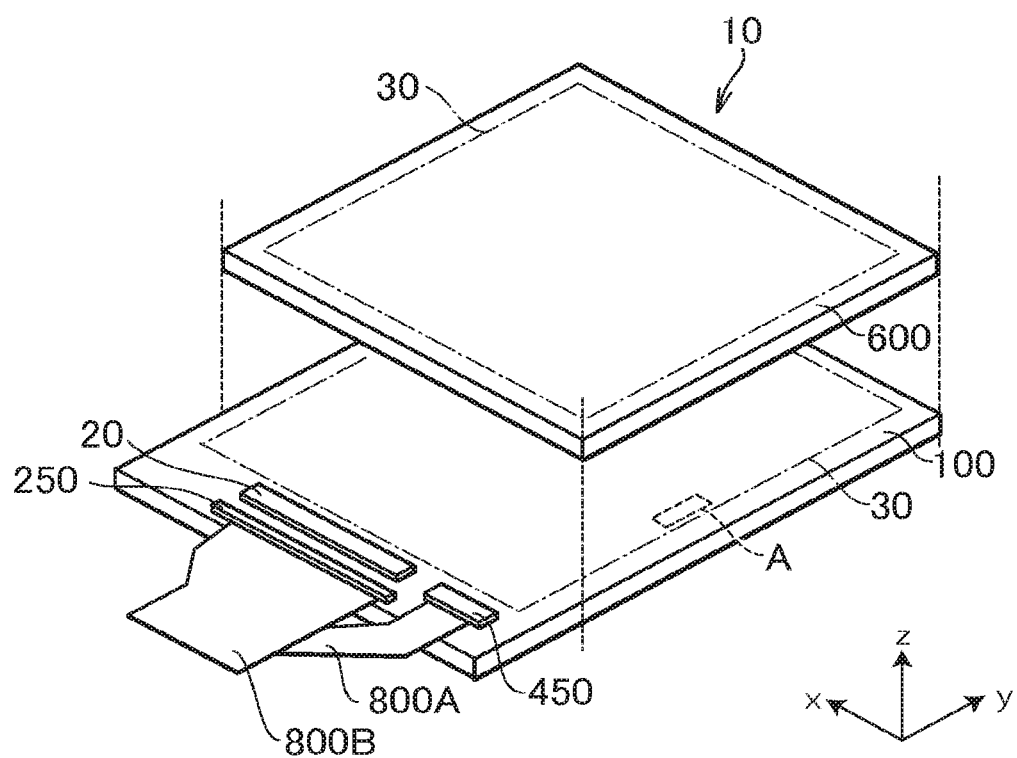
FIG. 1 is an exploded perspective view of an organic electroluminescent device with a touch sensor according to a first embodiment of the present invention.

Hereinafter, a display device according to an embodiment of the present invention will be described with reference to the accompanying drawings. FIG. 1 is an exploded perspective view of an organic electroluminescent device with a touch sensor 10 according to a first embodiment of the present invention.

As illustrated in FIG. 1, the organic electroluminescent device with a touch sensor 10 according to the first embodiment of the present invention includes a first substrate 100 and a second substrate 600. The organic electroluminescent device with a touch sensor 10 according to the first embodiment of the present invention displays an image on a display surface 30, and incorporates a touch sensor that detects that a finger touches any position of the display surface 30 thereinto.

A first substrate 100 included the organic electroluminescent device with a touch sensor 10 according to the first embodiment of the present invention is omitted from FIG. 1, but has a structure in which pixels each having a thin film transistor are arranged in a matrix on an insulating substrate. In this example, the insulating substrate may be made of, for example, glass, plastic (polycarbonate, polyethylene terephthalate, polyimide, polyacrylate, etc.).

Also, the first substrate 100 included in the organic electroluminescent device with a touch sensor 10 according so the first embodiment of the present invention may be made of, for example, a light transmissive material. In this example, as the insulating substrate configuring the first substrate 100, the light transmissive material may be glass, plastic (polycarbonate, polyethylene terephthalate, polyimide, polyacrylate, etc.). Also, as wirings and electrodes configuring the first substrate 100, the light transmissive material may be ITO or IZO. Also, the light transmissive material is not limited to the above examples.

Also, the first substrate 100 on which the circuits each using the thin film transistor are arranged is also called "a TFT (thin film transistor) substrate. In this example, the thin film transistor may include a semiconductor film made of polysilicon, a gate insulating film that covers the semiconductor film, a gate electrode that is arranged above the semiconductor film through the gate insulating film, and a source electrode and a drain electrode that penetrate through the gate insulating film, and are electrically connected to the semiconductor film. Also, as illustrated in FIG. 1, a driver circuit 20 for driving the circuits each using the thin film transistor which are arranged on the first substrate 100 may be arranged on the first substrate 100.

Also, the second substrate 600 included in the organic electroluminescent device with a touch sensor 10 according to the first embodiment of the present invention may be configured by a color filter substrate having a color filter that transmits a light having a given wavelength region among lights emitted from organic EL elements (refer to FIGS. 2 and 4A) arranged on the first substrate. The second substrate 600 which is the color filter substrate will be described in detail later.

Figure 2:
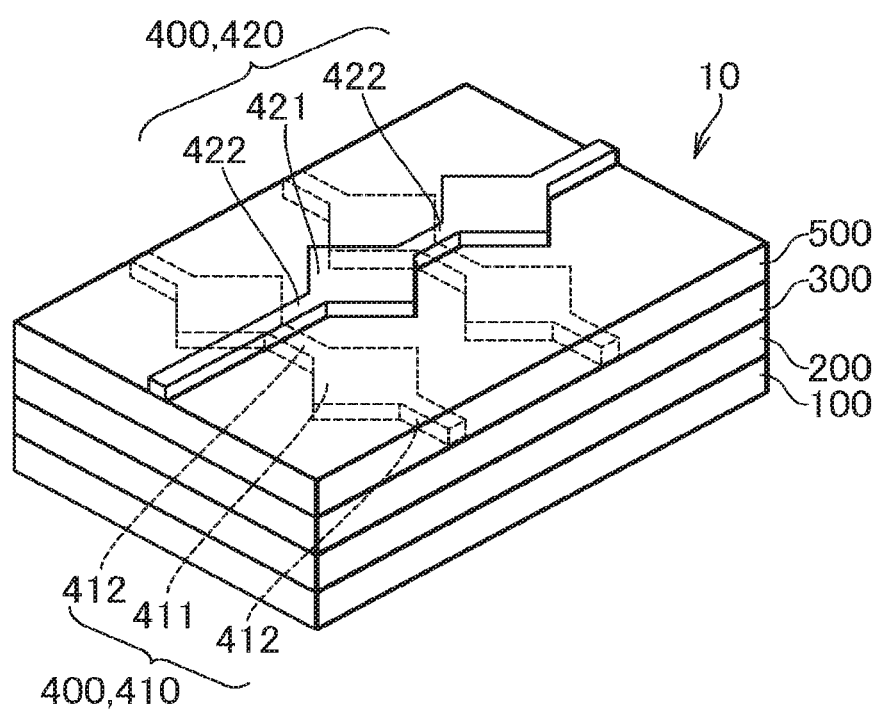
FIG. 2 is an enlarged diagram illustrating an A portion in FIG. 1, which is a perspective view schematically illustrating an arrangement of detection electrodes included in the organic electroluminescent device with a touch sensor according to the first embodiment of the present invention.

FIG. 2 is an enlarged diagram illustrating an A portion in FIG. 1, which is a perspective view schematically illustrating an arrangement of detection electrodes included in the organic electroluminescent device with a touch sensor 10 according to the first embodiment of the present invention.

As illustrated in FIG. 2, the organic electroluminescent device with a touch sensor 10 according to the first embodiment of the present invention includes a laminated structure in which a first substrate 100 having the circuits each using the thin film transistor, an organic EL element layer 200, a first sealing film 300, first detection electrodes 410 that extend in an X-direction, a second sealing film 500, and second detection electrodes 420 that extend in a Y-direction are laminated on each other in the stated order. Although parts of the first detection electrodes 410 and the second detection electrodes 420 are illustrated in FIG. 2, the plural first detection electrodes 410 and the plural second detection electrodes 420 are arranged in rows over the overall display surface 30.

Also, as illustrated in FIG. 2, the first detection electrodes 410 are arranged in a part of an area of the first sealing film 300 opposite to a side that comes in contact with the organic EL element layer 200. Also, the first detection electrodes 410, and the other portion of the first sealing film 300 in which the first detection electrodes 410 are not arranged on the first sealing film 300 are covered with the second sealing film 500. The second detection electrodes 420 are arranged in a partial area of the surface of the second sealing film 500.

The first detection electrodes 410 extending in the X-direction, and the second detection electrodes 420 extending in the Y-direction in FIG. 2 configure a capacitance type projection touch sensor 400. The capacitance type projection touch sensor will be described below.

Two kinds of a capacitance surface type and a capacitance projection type have been known as the capacitance type touch panel. Both of the capacitance surface type and the capacitance projection type are designed to detect a position at which a fingertip touches while capturing a change in the capacitance between the fingertip and the detection electrode. The touch sensor of the capacitance surface type detects the capacitance with the configuration small in the number of detection terminals such as a solid electrode film and electrode terminals of four corners. On the other hand, the touch sensor of the capacitance projection type employs a multi-point detection system for enhancing the detection sensitivity, and therefore employs a complicated configuration in which a plurality of first detection electrodes 410 extending in the X-direction sterically intersect with a plurality of second detection electrodes 420 extending in the Y-direction.

Figure 3:
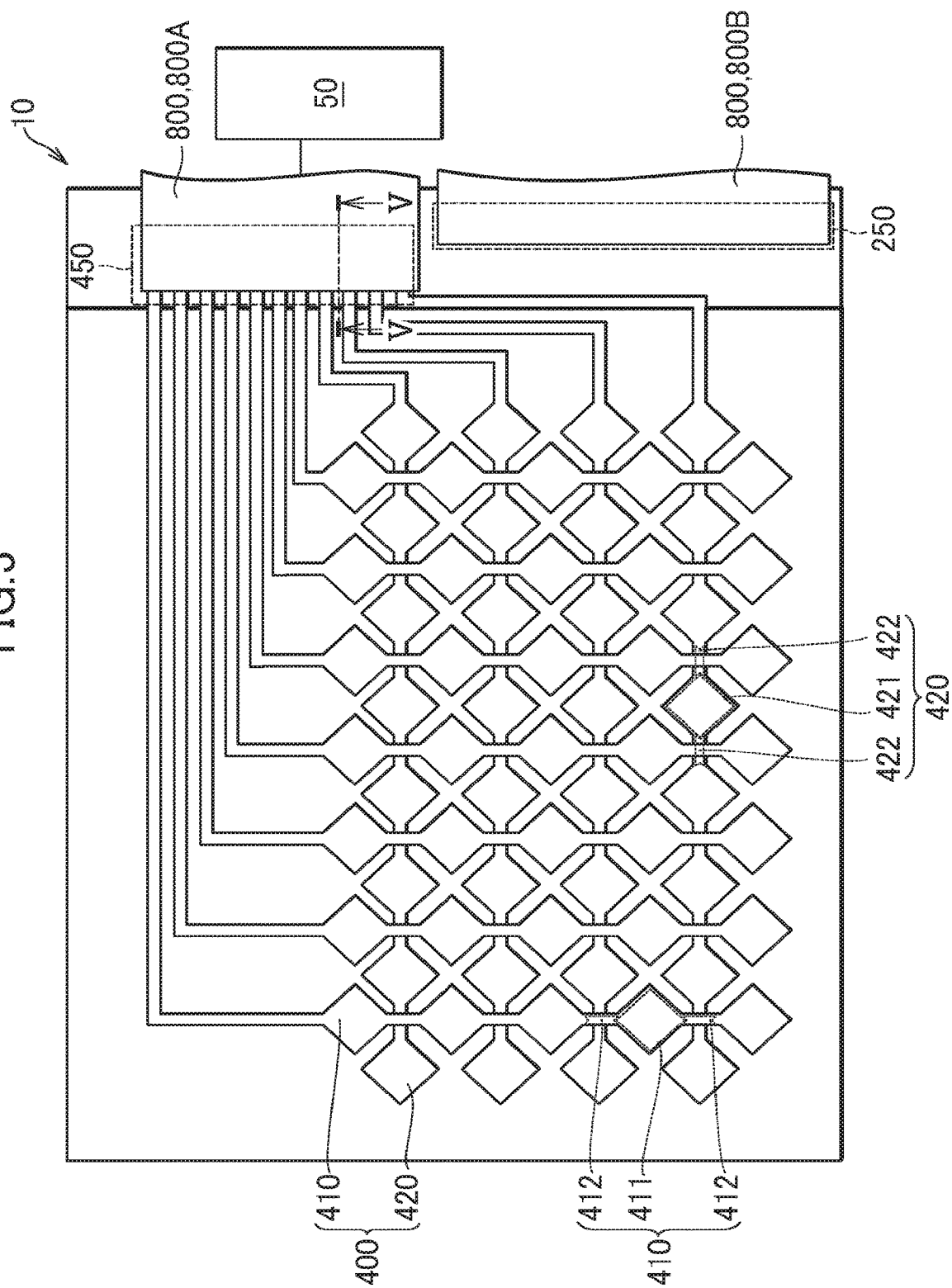
FIG. 3 is a plan view schematically illustrating the arrangement of the detection electrodes included in the organic electroluminescent device with a touch sensor according to the first embodiment of the present invention.

An arrangement relationship between the first detection electrodes 410 and the second detection electrodes 420 will be described in more detail. FIG. 3 is a plan view schematically illustrating the arrangement of the detection electrodes included in the organic electroluminescent device with a touch sensor 10 according to the first embodiment of the present invention.

As illustrated in FIG. 3, the first detection electrodes 410 and the second detection electrodes 420 are configured so that the rectangles (stripes) and/or the rhombi (diamonds) are aligned in lines to provide electrodes extending in the X-direction and the Y-direction, respectively. As compared with a solid electrode employed in the capacitance surface type, although the shape is complicated, the detection sensitivity of the touch sensor 400 is improved with the application of the detection electrodes having the shape in which the rectangles (stripes) and/or the rhombi (diamonds) are continuously arranged as described above. Therefore, this shape is preferable.

Also, the first detection electrodes 410 and the second detection electrodes 420 may be configured with the inclusion of main body portions 411 and 421 having the shape of the rectangles (stripes) and/or the rhombi (diamonds), and connection portions 412 and 422 that connect the main body portions 411 and 421 to the adjacent other main body portions 411 and 421.

Also, as illustrated in FIG. 3, lines led from the first detection electrodes 410 and the second detection electrodes 420 are connected to an external touch sensor control unit 50 through a flexible printed circuit board (FPC) 800A connected to a connection terminal 450 formed on the first substrate 100.

Also, one end of the first substrate 100 in the organic electroluminescent device with a touch sensor 10 according to the first embodiment of the present invention is equipped with a connection terminal 250 for driving the organic EL element layer 200. The one end of the first substrate 100 is connected to an external organic EL element control unit (not shown) through a flexible printed circuit board (FPC) 800B connected to the connection terminal 250.

In the organic electroluminescent device with a touch sensor 10 according to the first embodiment of the present invention, the respective connection terminals 450 and 250 connected with the touch sensor control unit 50 and the organic EL element control unit can be disposed on the first substrate 100 of the same plane. Although will be described later, the connection terminal 250 for driving the organic EL element layer 200 may coexist with the connection terminal 450 for touch sensor control provided on the first substrate 100. Also, a method of connecting the connection terminal portions will be described in more detail later.

Figure 4A:
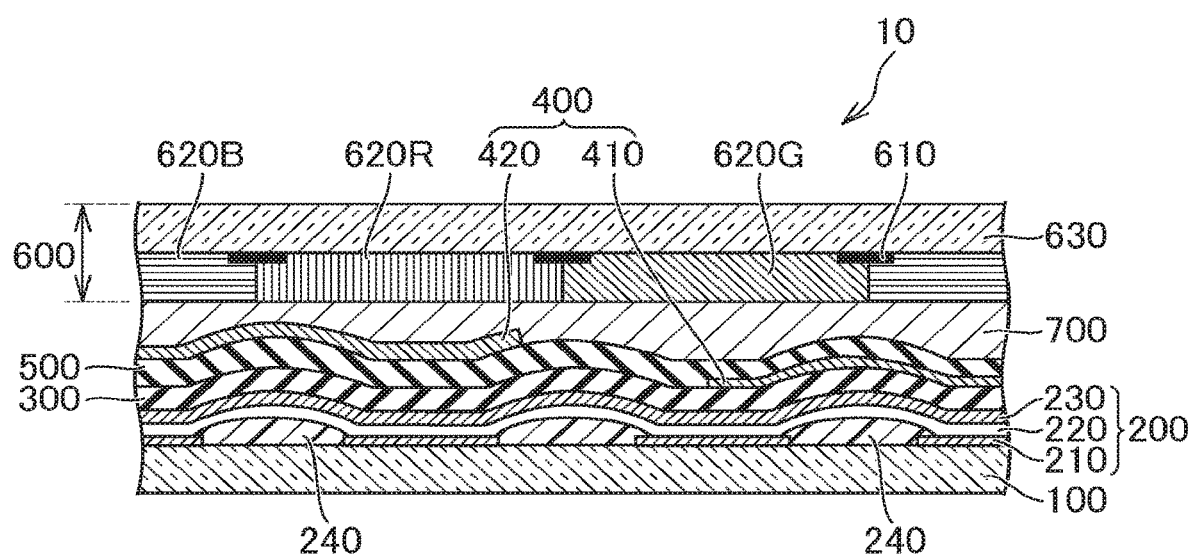
FIG. 4A is a cross-sectional view of the organic electroluminescent device with a touch sensor according to the first embodiment of the present invention.

Subsequently, the organic EL element layer 200 will be described. FIG. 4A is a cross-sectional view of the organic electroluminescent device with a touch sensor 10 according to the first embodiment of the present invention.

As illustrated in FIG. 4A, the organic EL element layer 200 including anodes 210, a cathode 230, and a light emitting layer 220 held between the anodes 210 and the cathode 230 is disposed on the first substrate 100.

Also, sealing films 300 and 500 that protect the organic EL element layer 200 are formed on the organic EL element layer 200, and the respective touch sensors 400 are disposed on the sealing films 300 and 500. That is, the organic EL element layer 200 and the touch sensor 400 are disposed on the first substrate 100.

Hereinafter, a description will be given of the organic EL element layer 200 included in the organic electroluminescent device with a touch sensor 10 according to the first embodiment of the present invention. The organic EL element layer 200 included in the organic electroluminescent device with a touch sensor 10 according to the first embodiment of the present invention has the anodes 210, the cathode 230, and the light emitting layer 220 held between the anodes 210 and the cathode 230, and is disposed on the above-described first substrate 100.

The anodes 210 and the cathode 230 in this embodiment may be each formed of a conductive film made of a transparent metal such as ITO or IZO. Each of the anodes 210 included in the organic EL element layer 200 is supplied with a current through the thin film transistor disposed on the first substrate 100. The current supplied to the anode 210 flows into the cathode 230 through the light emitting layer 220. The light emitting layer 220 held between the anode 210 and the cathode 230 emits light by recoupling electrons from the cathode 230 with holes from the anode 210. The external is irradiated with the emitted light.

Also, the cathode 230 in this embodiment is formed of a solid electrode formed over the substantially overall surface of the display surface 30 of the organic electroluminescent device with a touch sensor 10. The solid electrode is formed over the overall surface of a given area (in this embodiment, the display surface 30 of the organic electroluminescent device with a touch sensor 10). For that reason, even if a disconnection is slightly generated due to an uneven state of the surface, the function of the electrodes is not completely impaired.

A side of the organic EL element layer 200 opposite to the first substrate 100 side is equipped with the first sealing film 300. That is, a side, which faces the second substrate 600, of the cathode 230 located in the uppermost surface of the organic EL element layer 200 is provided with the first sealing film 300.

Also, as illustrated in FIG. 4A, banks 240 are formed on ends of the respective anodes 210 included in the organic EL element layer 200 so as to cover the ends thereof. The banks 240 cover the ends of the anodes 210 separated in the respective pixels to perform a function of defining the light emitting areas. Hence, as illustrated in FIG. 4A, the banks 240 are disposed at positions corresponding to a black matrix 610 provided on the color filter substrate (second substrate 600).

Also, the respective banks 240 cover the steps of the anode 210 ends formed on the first substrate 100 to perform a function of preventing short circuit between the anodes 210 and the cathode 230, which is caused by the disconnection of the light emitting layer 220 in the organic EL element layer 200. For that reason, as illustrated in FIG. 4A, the banks 240 are each formed to have a smooth curve surface.

For that reason, referring to FIG. 4A, the cathode 230, which is the solid electrode formed in the uppermost surface of the organic EL element layer 200, is formed with smooth unevenness following the shape of the banks 240. A surface of the first sealing film 300 disposed on a side of the organic EL element layer 200 opposite to the first substrate 100 side is also formed with unevenness following the surface shape of the cathode 230 which is the solid electrode formed in the uppermost surface of the organic EL element layer 200.

In this example, the first sealing film 300 is disposed for protecting the organic EL element layer 200 from moisture and oxygen from the external. Therefore, a material of the first sealing film 300 is selected taking water permeability and air permeability into account.

In this embodiment, the first sealing film 300 is formed of a first inorganic layer made of an inorganic material. Also, the first inorganic layer may be made of a compound selected from a compound group consisting of SiN, $SiO_2$, $P_2O_5.SiO_2$ (PSG), $Al_2O_3$, $PbO.SiO_2$, $Si_3Na_4$, SiON, and $PbO.B_2O_3$. It is preferable that the first sealing film 300 is made of SiN among those components. Also, the first sealing film 300 may be formed through, for example, CVD. The material and the forming method of the first sealing film 300 are not limited to those described above.

A thickness of the first sealing film 300 may be set to 0.5 to 5 μm. When the thickness of the first sealing film 300 may be set to 0.5 to 5 μm, the effect of protecting the organic EL element layer 200 is enhanced, which is preferable.

Because the first detection electrodes 410 formed on the first sealing film 300 configures the capacitance type projection touch sensor 400, the first detection electrodes 410 have a complicated shape such that, for example, rectangles (stripes) and/or the rhombi (diamonds) are aligned in lines as described above. For that reason, the first detection electrodes 410 become in an open state when the disconnection is generated unlike the solid electrode, and the function of the touch sensor 400 may be completely impaired. Therefore, the surface of the first; sealing film 300 is required to be flatter so that the first detection electrodes 410 are not disconnected.

Also, in particular, places in which the banks 240 are formed increase more as the organic electroluminescent display unit provided in the organic electroluminescent device with a touch sensor 10 becomes higher definition. As a result, the unevenness is liable to be more formed.

Also, the second sealing film 500 is provided for protecting the organic. EL element layer 200 from moisture or oxygen from the external as in the first sealing film 300. Therefore, a material of the second sealing film 500 is selected taking water permeability and air permeability into account.

The second sealing film 500 according to this embodiment is formed of a second inorganic layer made of an inorganic material. Also, the second inorganic layer may be made of a compound selected from a compound group consisting of SiN, $SiO_2$, $P_2O_5.SiO_2$ (PSG), $Al_2O_3$, $PbO.SiO_2$, $Si_3Na_4$, SiON, and $PbO.B_2O_3$. The second sealing film 500 is made of an organic material, but may be made of, for example, polyimide resin and/or derivative thereof. It is preferable that the first sealing film 300 is made of SiN among those components. Also, the second sealing film 500 may be formed through, for example, CVD. The material and the forming method of the second sealing film 500 are not limited to those described above.

Also, a thickness of the second sealing film 500 may be set to 0.5 to 5 μm. When the thickness of the second sealing film 500 may be set to 0.5 to 5 μm, the effect of protecting the organic EL element layer 200 is enhanced, which is preferable.

The second detection electrodes 420 formed on the second sealing film 500 have a complicated shape such that, for example, rectangles (stripes) and/or the rhombi (diamonds) are (continuously) aligned in lines as described above. For that reason, it is preferable that the surface of the second sealing film 500 on which the second detection electrodes 420 are formed is flat. This is because it is conceivable that the second detection electrodes 420 are disconnected by the unevenness of the surface of the second sealing film 500.

Also, the respective thicknesses of the first detection electrodes 410 and the second detection electrodes 420 may be set to 10 to 100 μm. When the respective thicknesses of the first detection electrodes 410 and the second detection electrodes 420 may be set to 10 to 100 μm, a sheet resistance can be reduced, which is preferable.

Also, the first detection electrodes 410 and the second detection electrodes 420 included in the organic electroluminescent device with a touch sensor 10 according to the first embodiment of the present invention may be formed through any one of a mask sputtering method and a printing method.

The organic electroluminescent device with a touch sensor 10 according to the first embodiment of the present invention incorporates the capacitance projection type touch panel for the purpose of enhancing the detection sensitivity. In order to realize the touch panel, there is a need to pattern the complicated shape illustrated in FIG. 3. Also, in the organic electroluminescent device with a touch sensor 10 according to the present invention, the organic EL element layer 200 and the touch sensor 400 are physically located at a short distance as illustrated in FIG. 4A in response to a request for thinning. Taking the above into account, it is preferable to employ a method in which the touch sensor 400 is formed preferably without using moisture and oxygen because the organic EL element layer 200 hate moisture and oxygen.

For example, the method of forming the detection electrodes trough etching is not preferable in the formation of the first detection electrodes 410 and the second detection electrodes 420 in the organic electroluminescent vice with a touch sensor 10 according to the first embodiment of the present invention because the method uses a large amount of waters for washing an etchant. Therefore, it is preferable that the first detection electrodes 410 and the second detection electrodes 420 included in the organic electroluminescent device with a touch sensor 10 according to the first embodiment of the present invention are each formed through any one of the sputtering method and the printing method. In the present specification, the printing method is, for example, an inkjet method or a letterpress printing method.

Also, when the first detection electrodes 410 and/or the second detection electrodes 420 are formed through the mask sputtering method, if there is no space between the mask and the substrate, an influence of scratch or foreign matter is conceivable. For that reason, it is preferable that a given space is created between the mask and the substrate to form the first detection electrodes 410 and/or the second detection electrodes 420. When the given space is created between the mask and the substrate to form the first detection electrodes 410 and/or the second detection electrodes 420, the ends of the first detection electrodes 410 and/or the second detection electrodes 420 are tapered. Therefore, the ends of the first detection electrodes 410 and/or the second detection electrodes 420 may be tapered.

Also, the first detection electrodes 410 and the second detection electrodes 420 may be each made of a transparent metal such as ITO or IZO, or a metal mesh, silver nanofibers, carbon nanofibers, or graphene.

The color filter substrate which is the second substrate 600 according to this embodiment may be of a structure in which three areas (620R, 620G, 620B) partitioned by RGB are formed on a transparent substrate 630 made of glass or resin. Also, a filling layer 700 made of, for example, an organic resin may be disposed between the second substrate 600 and the second detection electrodes 420.

As compared with the organic electroluminescent device having no touch sensor, the organic electroluminescent device with a touch sensor according to the first embodiment as described above can be realized by only an increase in the thickness of a sealing film structure including the first and second detection electrodes substantially configuring the touch sensor, and fulfills the request for thinning.

Figure 5A:
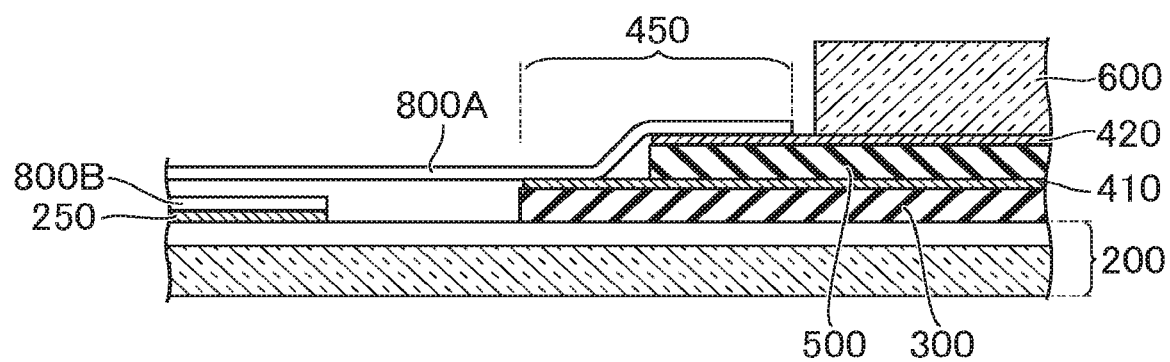
FIG. 5A is a schematic cross-sectional view illustrating a neighborhood of a part taken along a line V-V in FIG. 3.

Also, a description will be given of a method of connecting the connection terminal portions in detail below. FIG. 5A is a schematic cross-sectional view illustrating a neighborhood of a part taken along a line V-V in FIG. 3. As illustrated in FIG. 5A, the connection terminal 450 of the touch sensor 400, and the connection terminal 250 of the organic EL element layer 200 provided in the organic electroluminescent device with a touch sensor 10 are formed on the same substrate (on the first substrate 200).

As illustrated in FIG. 5A, the first sealing film 300 and the second sealing film 500 are removed on ends thereof in stages. With this configuration, one end of the first detection electrodes 410 and one end of the second detection electrodes 420 are exposed as the connection terminal 450 of the touch sensor 400. That is, the connection terminal 450 of the touch sensor 400 is configured by one end of the first detection electrodes 410, and one end of the second detection electrodes 420.

A flexible printed circuit board (FPC) 800A connected to the connection terminal 450 of the touch sensor 400 is connected to one end of the first detection electrodes 410, and one end of the second detect ion electrodes 420. Also, the connection terminal 250 of the organic EL element layer 200 is connected to another flexible printed circuit board (FPC) 800B different from the flexible printed circuit board (FPC) 800A connected to the connection terminal 450 of the touch sensor 400.

Figure 5B:
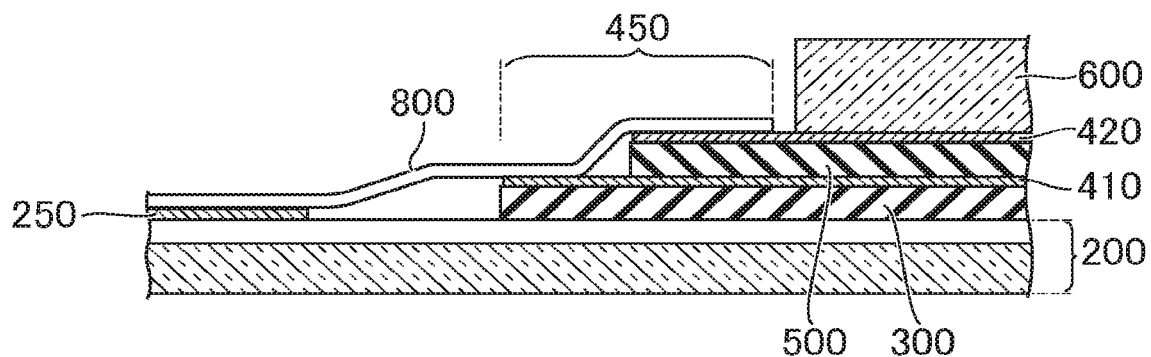
FIG. 5B is a cross-sectional view illustrating another example of a neighborhood of a connection terminal portion in a display device according to the present invention.

FIG. 5B is a cross-sectional view illustrating another example of a neighborhood of a connection terminal portion in the display device 10 according to the present invention. As illustrated in FIG. 5B, the connection terminal 450 of the touch sensor 400 and the connection terminal 250 of the organic EL element layer 200 are connected to a common flexible printed circuit board (FPC) 800.

As described above, the connection terminal 450 of the touch sensor 400 and the connection terminal 250 of the organic EL element layer 200 are connected to one flexible printed circuit board (FPC) 800, hereby being capable of simplifying the connecting process, and reducing the members. As a result, a reduction in the manufacture cost is realized.

Figure 6B:
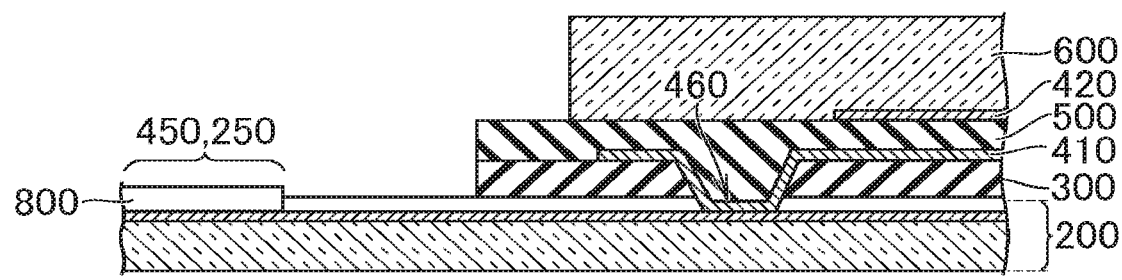
FIG. 6B is a schematic cross-sectional view of a neighborhood of a part taken along a line VI-VI in FIG. 6A.

FIG. 6A is a plan view schematically illustrating an arrangement of detection electrodes included in an organic electroluminescent device with a touch sensor 10 according to another embodiment of the present invention. FIG. 6B is a schematic cross-sectional view of a neighborhood of a part taken along a line VI-VI in FIG. 6A. FIG. 6B is a cross-sectional view illustrating another example of a neighborhood of the connection terminal portion in the organic electroluminescent device with a touch sensor 10 according to the present invention.

As illustrated in FIG. 6B, the first detection electrodes 410 and the second detection electrodes 420 which configure the touch sensor 400 are electrically connected to lead lines connected to the connection terminal 450 disposed on the first substrate 100, through a contact hole 460 formed in ends of those detection electrodes.

With the application of the above structure, the connection terminal 450 of the touch sensor 400 and the connection terminal 250 of the organic EL element layer 200 are formed in the same plane of the first substrate 200. For that reason, the electric connection with the external circuit is further facilitated.

Also, the organic electroluminescent device with a touch sensor connected to the contact hole 460 as described above fulfills a request for thinning, and has the effect of facilitating the electric connection with the external circuit.

Second Embodiment

Hereinafter, a description will be given an embodiment in which even if a higher-definition organic electroluminescent display unit is applied to the organic electroluminescent device with a touch sensor 10, the disconnection of the detection electrodes configuring the touch sensor is suppressed while thinning the device.

An organic electroluminescent device with a touch sensor 10 according to a second embodiment of the present invention is different from the organic electroluminescent device with a touch sensor 10 according to the first embodiment in that the first sealing film 300 is configured by the first sealing film 300 and a first planarizing layer 310.

Figure 4B:
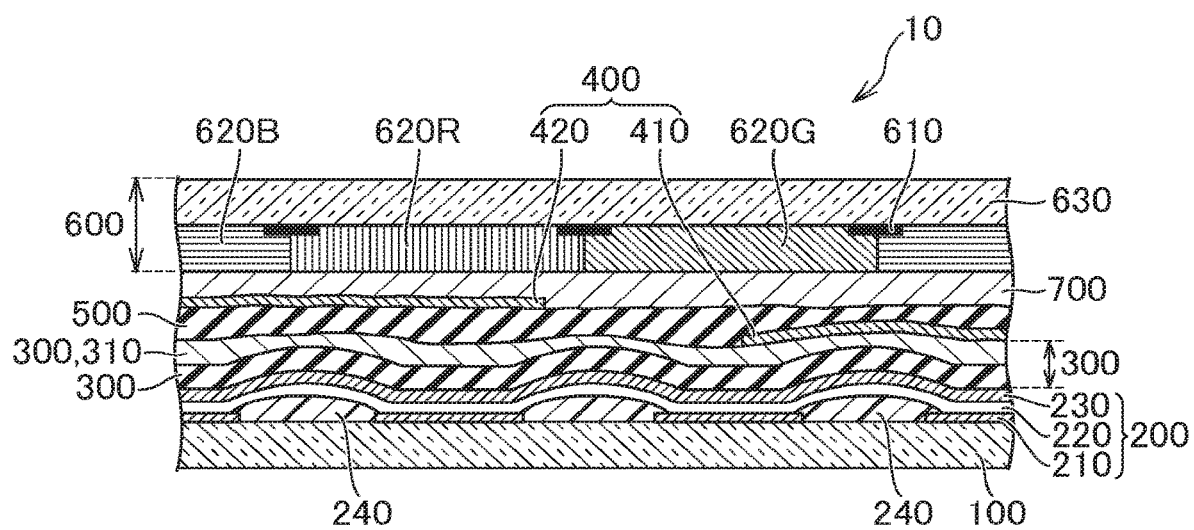
FIG. 4B is a cross-sectional view of an organic electroluminescent device with a touch sensor according to a second embodiment of the present invention.

FIG. 4B is a cross-sectional view of the organic electroluminescent device with a touch sensor 10 according to the second embodiment of the present invention. As illustrated in FIG. 4B, the first sealing film 300 of the organic electroluminescent device with a touch sensor 10 according to the second embodiment has the first planarizing layer 310 that is formed on the second substrate side of the first sealing film 300, and flattens the unevenness of the surface.

In this example, the first planarizing layer 310 is made of an organic material. The first planarizing layer 310 is provided for the purposes of planarizing the unevenness of a surface of a side of the first sealing film 300 where the first detection electrodes 410 is disposed, and reducing an influence of a capacitance formed between the first planarizing layer 310 and the cathode 230. Therefore, the thickness of the first planarizing layer 310 may be appropriately selected. When varnish (liquid material in which organic resin is dissolved in a solvent) of organic resin is coated on an uneven surface whereby the varnish preferentially flows into a concave portion to effectively flatten the unevenness of the surface of the first sealing film 300.

Also, the first planarizing layer 310 may be made of, for example, an organic resin. The organic resin applied to the first planarizing layer 310 may be selected from a group consisting of, for example, acrylic, polyimide, epoxy, and an optically clear adhesive (OCA). Apart from the method of coating the organic material, the organic material may be formed by a low-temperature vapor deposition method or a resin sheet sticking method. Also, the first planarizing layer 310 may be gradually thinned toward the outside from the display surface 30, and the first sealing film 300 may come in contact with the second sealing film 500 on the outermost portion. With this configuration, the penetration of moisture from the external can be effectively prevented.

Also, the first planarizing layer 310 may have a thickness of 1 to 100 μm. It is preferable to set the first planarizing layer 310 to 10 μm or higher because the effect of suppressing the disconnection of the touch sensor is enhanced, and an influence of the capacitance between the cathode 230 and the touch sensor 400 can be reduced. Also, although an upper limit of the thickness of the first planarizing layer 310 is not particularly defined, because an increase in the thickness of the first planarizing layer 310 is disadvantageous to thinning, the upper limit of the thickness may be set to, for example, be equal to or lower than 80 μm, or lower than 80 μm.

The material and the forming method of the first planarizing layer 310 are not limited to those described above.

As compared with the organic electroluminescent device having no touch sensor, the organic electroluminescent device with a touch sensor according to the second embodiment as described above can be realized by only an increase in the thickness of the first and second detection electrodes substantially configuring the touch sensor, and the thickness of the first planarizing layer, and fulfills the request for thinning. Also, the organic electroluminescent device with a touch sensor according to the second embodiment has the effect of suppressing the disconnection of the touch sensor, and also the effect of enhancing the reliability of the device.

Also, the organic electroluminescent device with a touch sensor according to the second embodiment as described above may employ the connection structure of the connection terminal described in the organic electroluminescent device with a touch sensor according to the first embodiment.

Also, the second sealing film 500 may have a second planarizing layer (not shown) that flattens the unevenness of the surface in an area where at least the second detection electrode 420 is arranged, on a side facing the second substrate 600.

Also, when the second sealing film 500 has the second planarizing layer, the second planarizing layer may be made of, for example, an organic resin. Because the second planarizing layer is provided for the purpose of planarizing the unevenness of the surface, there is no need to select any material taking water permeability and air permeability, which are functions of the second flattering layer, into account. Also, when varnish (liquid material in which organic resin is dissolved in a solvent) of organic resin is coated on an uneven surface whereby the varnish preferentially flows into a concave portion with the result that the unevenness of the surface of the second sealing film 500 can be effectively flattened, which is preferable.

The material and the forming method of the second planarizing layer are not limited to those described above.

Also, the second planarizing layer may have a thickness of 1 to 100 μm. It is preferable to set the second planarizing layer to 10 μm or higher because the effect of suppressing the disconnection of the touch sensor is enhanced. Also, although an upper limit of the thickness of the second planarizing layer is not particularly defined, because an increase in the thickness of the second planarizing layer is disadvantageous to thinning, the upper limit of the thickness may be set to, for example, be equal to or lower than 80 μm, or lower than 80 μm.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   a first substrate having an insulating surface;
   a display region having a plurality of pixels on the insulating surface, each of the plurality of pixels having a display element;
   a first sealing layer covering the display region;
   a pair of detection electrodes on the first sealing layer; and
   a plurality of terminals outside the display region on the first substrate, wherein
   the pair of detection electrodes have a first detection electrode layer and a second detection electrode layer,
   each of the first detection electrode layer and the second detection electrode layer has a protruding surface at an opposite side from the first sealing film,
   a second sealing layer is between the first detection electrode layer and the second detection electrode layer,
   the second sealing layer is in contact with the protruding surface of the first detection electrode layer,
   a third sealing layer is on the second detection electrode layer,
   the third sealing layer is in contact with the protruding surface of the second detection electrode layer, and
   one of the pair of detection electrodes is connected to one of the plurality of terminals via a contact hole formed in the first sealing layer.

2. The display device according to claim 1, wherein the third sealing layer covers a region above the contact hole.

3. The display device according to claim 1, wherein the display element includes an anode, a cathode, and an EL layer between the anode and the cathode,
   the cathode is commonly formed across the plurality of pixels, and the cathode is entirely in contact with the first sealing layer.

4. A display device comprising:

a first substrate having an insulating surface;

a display region having a plurality of pixels on the insulating surface, each of the plurality of pixels having a display element;

a lower sealing layer covering the display region;

a pair of detection electrodes on the lower sealing layer;

an upper sealing layer covering the pair of detection electrodes; and a plurality of terminals outside the display region on the first substrate, wherein one of the pair of detection electrodes is connected to one of the plurality of terminals via a contact hole formed in the lower sealing layer, the upper sealing layer covers a region above the contact hole, the pair of detection electrodes comprise a first detection electrode layer and a second detection electrode layer, a middle sealing layer is between the first detection electrode layer and the second detection electrode layer, the first detection electrode layer is between the lower sealing layer and the middle sealing layer, and the second detection electrode layer is between the middle sealing layer and the upper sealing layer.

5. The display device according to claim 4, wherein the upper sealing layer extends from a region above the display region to the region above the contact hole continuously.

6. The display device according to claim 4, wherein the display element includes an anode, a cathode, and an EL layer between the anode and the cathode, the cathode is commonly formed across the plurality of pixels, and the cathode is entirely in contact with the lower sealing layer.

* * * * *